(12) United States Patent
Lin

(10) Patent No.: US 8,330,543 B2
(45) Date of Patent: Dec. 11, 2012

(54) DIFFERENTIAL AMPLIFIER

(75) Inventor: Yung-Cheng Lin, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 83 days.

(21) Appl. No.: 12/980,340

(22) Filed: Dec. 29, 2010

(65) Prior Publication Data

US 2012/0075022 A1 Mar. 29, 2012

(30) Foreign Application Priority Data

Sep. 27, 2010 (TW) .............................. 99132639 A

(51) Int. Cl.
*H03F 3/45* (2006.01)

(52) U.S. Cl. ...................................... 330/253; 330/258

(58) Field of Classification Search .................. 330/253, 330/255, 258, 261
See application file for complete search history.

(56) References Cited

U.S. PATENT DOCUMENTS

| 6,052,025 A * | 4/2000 | Chang et al. ................... 330/253 |
| 6,970,043 B2 * | 11/2005 | Pradhan et al. ................ 330/253 |
| 7,532,072 B1 * | 5/2009 | Tavakoli Dastjerdi et al. .............................. 330/258 |

* cited by examiner

*Primary Examiner* — Robert Pascal
*Assistant Examiner* — Khiem Nguyen
(74) *Attorney, Agent, or Firm* — Jianq Chyun IP Office

(57) ABSTRACT

A differential amplifier includes a pair of input transistors, a pair of load transistors, a pair of impedance devices, a pair of auxiliary input transistors, and a pair of shield transistors is provided. The input transistors provide two input terminals. The load transistors provide two output terminals and two first terminals connected to first voltage. The impedance devices are coupled between the output terminals in series. The auxiliary input transistors have two control terminals respectively connected to the input terminals, two first terminals, and two second terminals. The input transistors and the auxiliary input transistors have reverse conductive type. The shield transistors has a pair of control terminals, a pair of first terminals respectively connected to the second terminals of the auxiliary input transistors and coupled to a second voltage through a pair of current sources, and a pair of second terminals respectively connected to the output terminals.

12 Claims, 15 Drawing Sheets

DIFFERENTIAL AMPLIFIER

CROSS-REFERENCE TO RELATED APPLICATION

This application claims the priority benefit of Taiwan application serial no. 99132639, filed on Sep. 27, 2010. The entirety of the above-mentioned patent application is hereby incorporated by reference herein and made a part of this specification.

BACKGROUND OF THE INVENTION

1. Field of the Invention

The present invention relates to a differential amplifier with an input auxiliary circuit and a shield circuit such that the range of an input common-mode voltage is extended and the operation speed is increased.

2. Description of Related Art

A differential amplifier is an essential unit in an electronic device for analog signal processing. In data transmission, differential amplifier is used for frond-end receiver to amplifying desired signals. Because most communication channels require higher operation speed and wider voltage range, the conventional differential amplifier has to be improved.

FIG. 1 is a diagram of a conventional differential amplifier. Referring to FIG. 1, in the conventional differential amplifier, a pair of N-type metal-oxide-semiconductor (NMOS) transistors (i.e., the NMOS transistors 100 and 102) is disposed as a pair of input transistors of the differential amplifier. A pair of gates of the NMOS transistors receives a pair of differential voltage signals, and a pair of sources thereof is connected to a system low voltage (for example, a ground voltage) through a current source 108.

The load of the differential amplifier is a pair of P-type MOS (PMOS) transistors (i.e., the PMOS transistors 104 and 106), and the PMOS transistors are diode-connected. The common-mode voltage of output terminals 110 and 112 in foregoing structure is determined by the voltage level of a system high voltage VDD. Namely, the output common-mode voltage is the system high voltage minus the $V_{SG}$ voltage of the PMOS transistors 104 and 106.

By using the diode-connected PMOS transistors as the load of a differential amplifier, the operation speed of the differential amplifier is limited. This is because when the input transistors of differential amplifier are completely switched, all the current in the current source 108 flows to one side of input transistors, and the current at the other side is zero. Accordingly, one side of the diode-connected PMOS transistors 104 (or 106) charges the corresponding output terminal. The charging current decreases as the output voltage increases due to the decrease of $V_{SG}$ voltage of the diode-connected PMOS transistors. Namely, the equivalent resistance of the diode-connected PMOS transistors increases with the increase of the output voltage (i.e., the RC time constant of the output terminal increases with time), so that the high voltage level of the output terminals cannot reach a stable state.

In other words, when the input differential signal is random data, the output high voltage level varies with the frequency of the input data pattern. As a result, the output signals generated by the differential amplifier will suffer from inter-symbol interference (ISI).

FIG. 2 is a diagram of a conventional differential amplifier. Referring to FIG. 2, this conventional differential amplifier adopts a similar design as the differential amplifier illustrated in FIG. 1 in order to achieve higher operation speed, wherein the NMOS transistors 100 and 102 are disposed as an input pair, and the load thereof is still implemented with the PMOS transistors 104 and 106. However, two impedance devices R1 and R2 are disposed for detecting the common-mode voltage of the output terminals, and the impedance devices R1 and R2 are connected to the gates of the PMOS transistors 104 and 106. In this structure, the output common-mode voltage is determined by the system high voltage VDD, and which is the system high voltage VDD minus the $V_{SG}$ voltage for the PMOS transistors 104 and 106.

The differential amplifier illustrated in FIG. 2 is more suitable to high-speed operation than the differential amplifier illustrated in FIG. 1. This is because the gates of the PMOS transistors 104 and 106 are common-mode terminals. Ideally, the output common-mode voltage does not change with the differential signals. Namely, the PMOS transistors 104 and 106 are not turned off during current switching, and ideally, a fixed voltage $V_{SG}$ and a fixed charging current are maintained. In addition, the equivalent differential resistance at the output terminals 110 and 112 is determined by the equivalent resistance of the impedance devices R1 and R2, and which does not change with the output voltage. Namely, a fixed RC time constant is kept at the output terminals. With sufficient circuit bandwidth, the level of the output voltage does not change with the frequency of the input data pattern. Accordingly, ISI will on be produced.

However, even though the circuit structure described above is suitable to high operation speed, the lowest input common-mode voltage is limited, wherein the lowest input common-mode voltage has to be higher than the voltage required by the current source 108 plus the $V_{GS}$ voltage of on the NMOS input transistors 102 and 104.

Thereby, the circuit structures of conventional differential amplifiers still need to be further improved to achieve a better performance.

SUMMARY OF THE INVENTION

Accordingly, the present invention is directed to a differential amplifier, wherein the operation speed is increased and the range of an input voltage is extended.

The present invention provides a differential amplifier including a pair of input transistors, a pair of load transistors, a pair of impedance devices, a pair of auxiliary input transistors, and a pair of shield transistors. The pair of input transistors provides a pair of input terminals. The pair of load transistors provides a pair of output terminals and a pair of first terminals, wherein the pair of first terminals are connected to a first voltage. The pair of impedance devices is connected between the pair of output terminals in series. The pair of auxiliary input transistors has a pair of control terminals, a pair of first terminals, and a pair of second terminals, wherein the pair of control terminals is respectively connected to the pair of input terminals, and the pair of input transistors and the pair of auxiliary input transistors has reverse conductive type. The pair of shield transistors has a pair of control terminals, a pair of first terminals, and a pair of second ten finals, wherein the pair of first terminals is respectively connected to the pair of second terminals of the pair of auxiliary input transistors and is coupled to a second voltage through a pair of current sources, and the pair of second terminals is respectively connected to the pair of output terminals.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
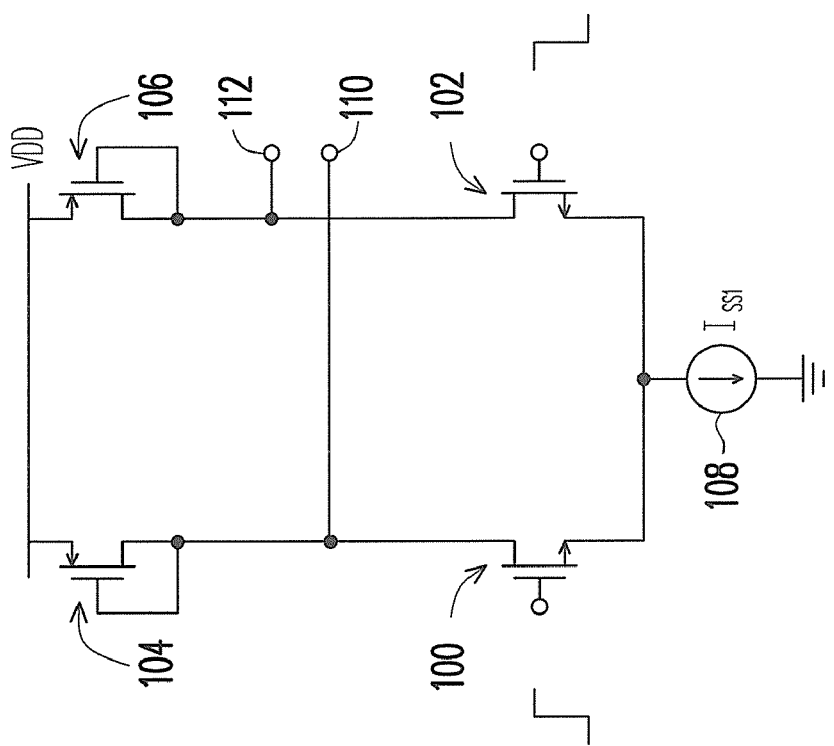
FIG. 1 is a diagram of a conventional differential amplifier.
Figure 2:
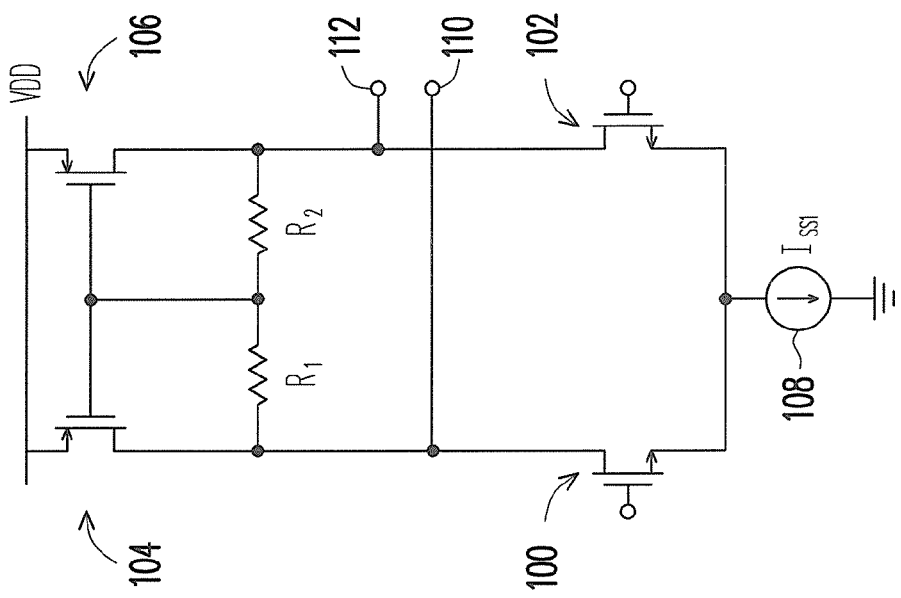
FIG. 2 is a diagram of a conventional differential amplifier.

Reference will now be made in detail to the present preferred embodiments of the invention, examples of which are illustrated in the accompanying drawings. Wherever possible, the same reference numbers are used in the drawings and the description to refer to the same or like parts.

The present invention provides a differential amplifier with increased operation speed and extended input voltage range. Below, the present invention will be described with reference to some embodiments. However, these embodiments are not intended to limit the scope of the present invention, and which may be appropriately integrated to achieve other embodiments.

Herein it should be noted that a metal-oxide-semiconductor (MOS) transistor may be replaced with a bipolar-junction transistor (BJT) in the circuit design. However, following embodiments are described with MOS transistors only. The gate, source, and drain of a MOS transistor may be corresponding to the base of a BJT and a first terminal and a second terminal constituted by the emitter and the collector thereof.

Figure 3:
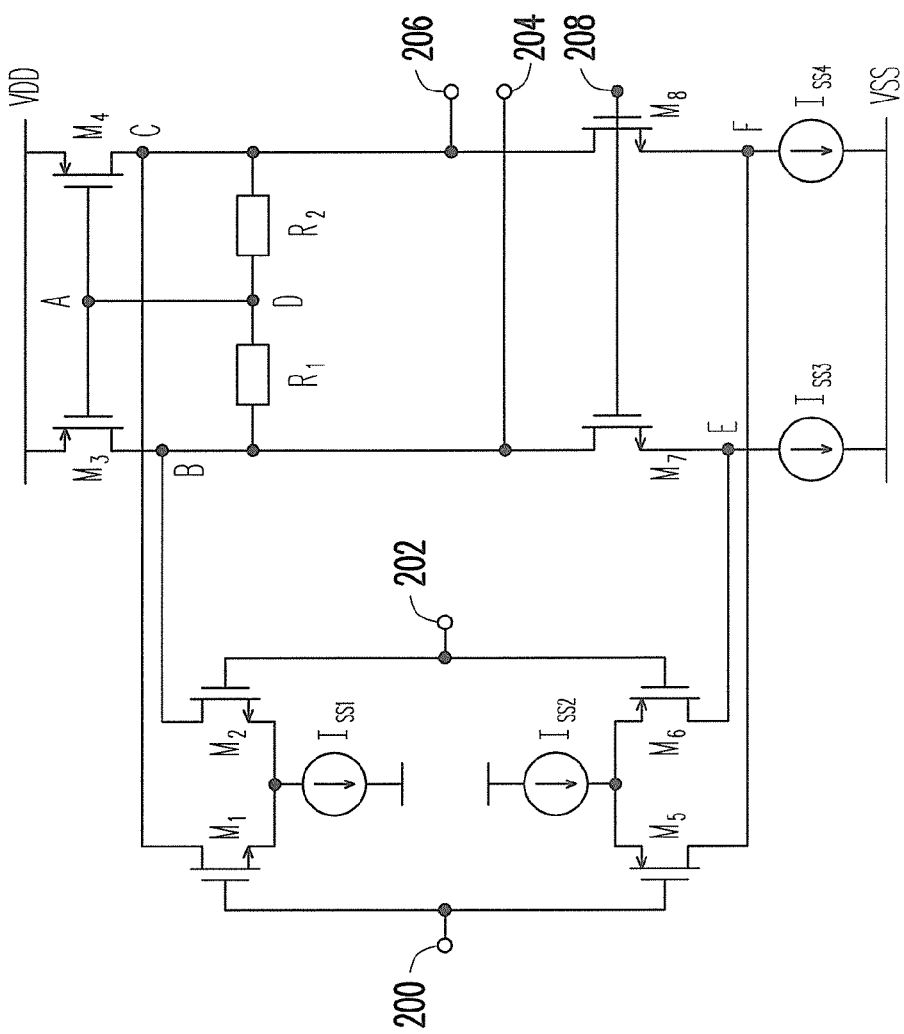
FIG. 3 is a circuit diagram of a differential amplifier according to an embodiment of the present invention.

FIG. 3 is a circuit diagram of a differential amplifier according to an embodiment of the present invention. Referring to FIG. 3, the differential amplifier includes a pair of input transistors M1 and M2, a pair of load transistors M3 and M4, and a pair of impedance devices R1 and R2. The pair of input transistors M1 and M2 provides a pair of input terminals 200 and 202. The pair of load transistors M3 and M4 provides a pair of output terminals 204 and 206 (i.e., nodes B and C). The drains of the input transistors M1 and M2 are respectively connected to the nodes B and C. The sources of the input transistors M1 and M2 are respectively coupled to a system low voltage VSS through a current source ISS1. The load transistors M3 and M4 have a pair of sources connected to a system high voltage VDD. The pair of impedance devices R1 and R2 are connected between the output terminals 204 and 206 in series, wherein the nodes A and D are the same terminal, the node A is the gates of the load transistors M3 and M4, and the node D is the serially connected terminal of the impedance devices R1 and R2.

The differential amplifier also includes a pair of auxiliary input transistors M5 and M6. The auxiliary input transistors M5 and M6 may be P-type MOS (PMOS) transistors, and which have a pair of gates, a pair of sources, and a pair of drains, wherein the two gates are respectively connected to the input terminals 200 and 202. The input transistors M1 and M2 and the auxiliary input transistors M5 and M6 have reverse conductive type. For example, the input transistors M1 and M2 are N-type MOS (NMOS) transistors, and the auxiliary input transistors M5 and M6 are PMOS transistors. The sources of the auxiliary input transistors M5 and M6 are respectively coupled to the system high voltage VDD through a current source ISS2.

The differential amplifier further includes a pair of shield transistors M7 and M8. The shield transistors M7 and M8 may be NMOS transistors, which have a pair of gates, a pair of sources, and a pair of drains, wherein the sources are respectively connected to the drains of the auxiliary input transistors M5 and M6 on nodes E and F and are coupled to the system low voltage VSS through a pair of current sources ISS3 and ISS4, the drains are respectively connected to the output terminals 204 and 206, and the gates are connected to a control terminal 208.

Regarding the operation of the differential amplifier, the pair of PMOS auxiliary input transistors M5 and M6 extends the range of the input common-mode voltage. Besides, the drains of the auxiliary input transistors M5 and M6 are connected to the sources of the NMOS shield transistors M7 and M8 and the shield transistors M7 and M8 provide a shielding property so that the voltage at the drains of the auxiliary input transistors M5 and M6 will not be affected by the VDD supply voltage. For example, because the output common-mode voltage is determined by the VDD supply voltage, the voltage on the output terminals 204 and 206 increases with the increase of VDD supply voltage. However, the existence of the NMOS shield transistors M7 and M8 prevents the voltage at the drains of the PMOS auxiliary input transistors M5 and M6 from being affected by the VDD supply voltage, so that the PMOS auxiliary input transistors M5 and M6 can still operate in the saturation region.

Additionally, the shield transistors M7 and M8 are also served as current buffers for adding up the current signals generated by the auxiliary input transistors M5 and M6 and the current signals generated by the input transistors M1 and M2, and the combined current signals flow through equivalent load to generate a corresponding differential output voltage. The gain of the circuit is increased due to the disposition of the PMOS auxiliary input transistors M5 and M6.

In the present embodiment, the output common-mode voltage of the output terminals 204 and 206 is detected by the impedance devices R1 and R2 and connected to the gates of the load transistors M3 and M4 (i.e., the nodes A and D). Thus, the nodes A and D at the gates of the load transistors M3 and M4 are common-mode terminals. Ideally, the output common-mode voltage does not change with the differential signal. Namely, the load transistors M3 and M4 are not turned off during current switching. Ideally, the load transistors M3 and M4 have a fixed $V_{SG}$ voltage and a fixed charging current. In addition, the equivalent differential resistance observed at output terminals 204 and 206 is determined by the equivalent resistances of the impedance devices R1 and R2 and does not change with the output voltage. Accordingly, a fixed RC time constant is kept at the output terminals 204 and 206.

In the differential amplifier described above, the impedance devices R1 and R2 may be resistors or achieve the desired resistances through the connection of the MOS transistors. In addition, the current sources ISS3 and ISS4 may also be implemented with resistors or MOS transistors.

Figure 4:
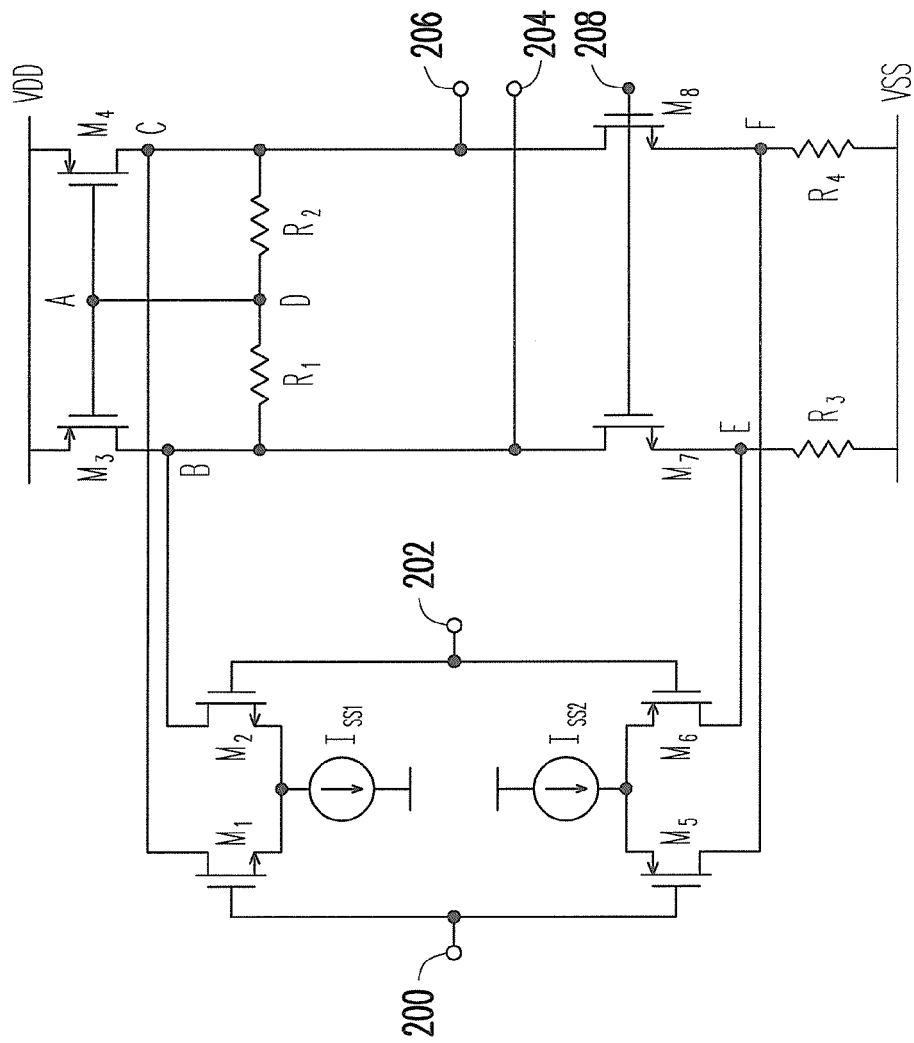
FIG. 4 is a circuit diagram of a differential amplifier according to an embodiment of the present invention.

FIG. 4 is a circuit diagram of a differential amplifier according to an embodiment of the present invention. The differential amplifier in FIG. 4 is derived from the differential amplifier illustrated in FIG. 3 by implementing the impedance devices R1 and R2 with resistors. Besides, the current sources ISS3 and ISS4 may be resistors R3 and R4 for generating bias currents.

Figure 5:
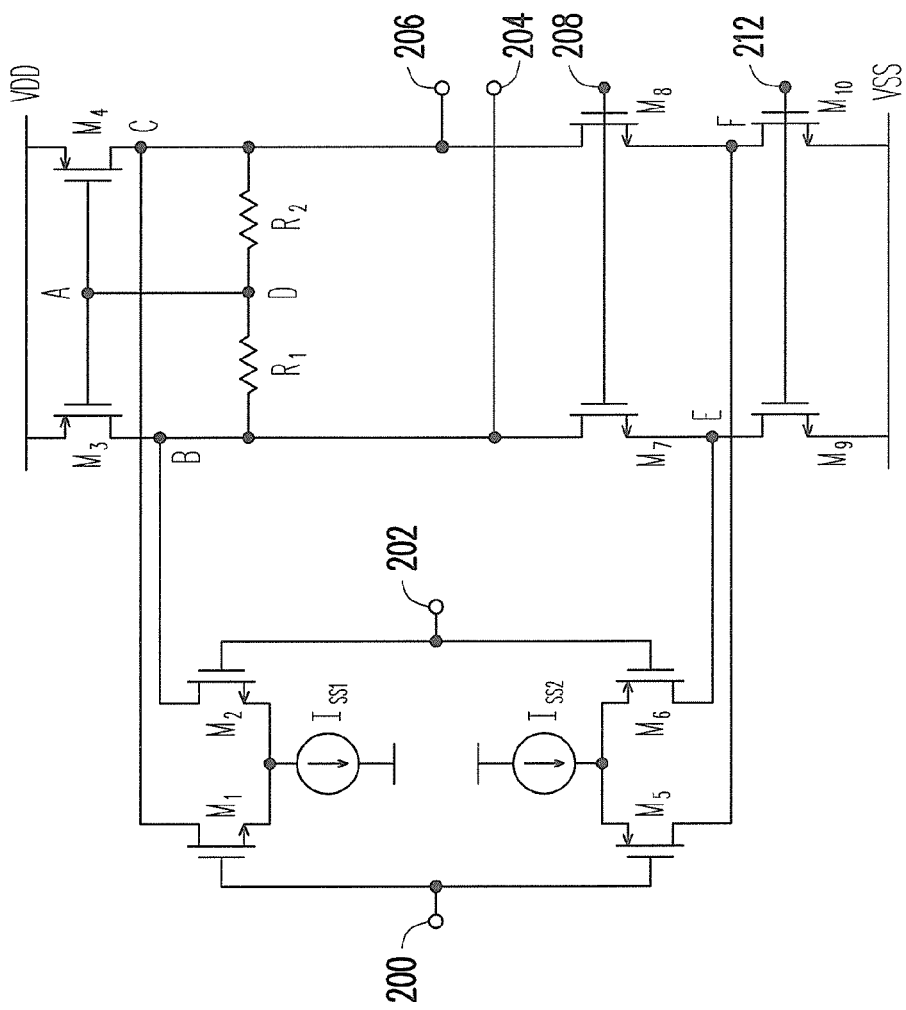
FIG. 5 is a circuit diagram of a differential amplifier according to an embodiment of the present invention.

FIG. 5 is a circuit diagram of a differential amplifier according to an embodiment of the present invention. The differential amplifier in FIG. 5 is another variation of the differential amplifier illustrated in FIG. 3, wherein the impedance devices R1 and R2 are implemented with resistors. In addition, the current sources ISS3 and ISS4 may be NMOS transistors M9 and M10 for generating bias currents. The gates of the transistors M9 and M10 are both connected to a control terminal 212.

Figure 6:
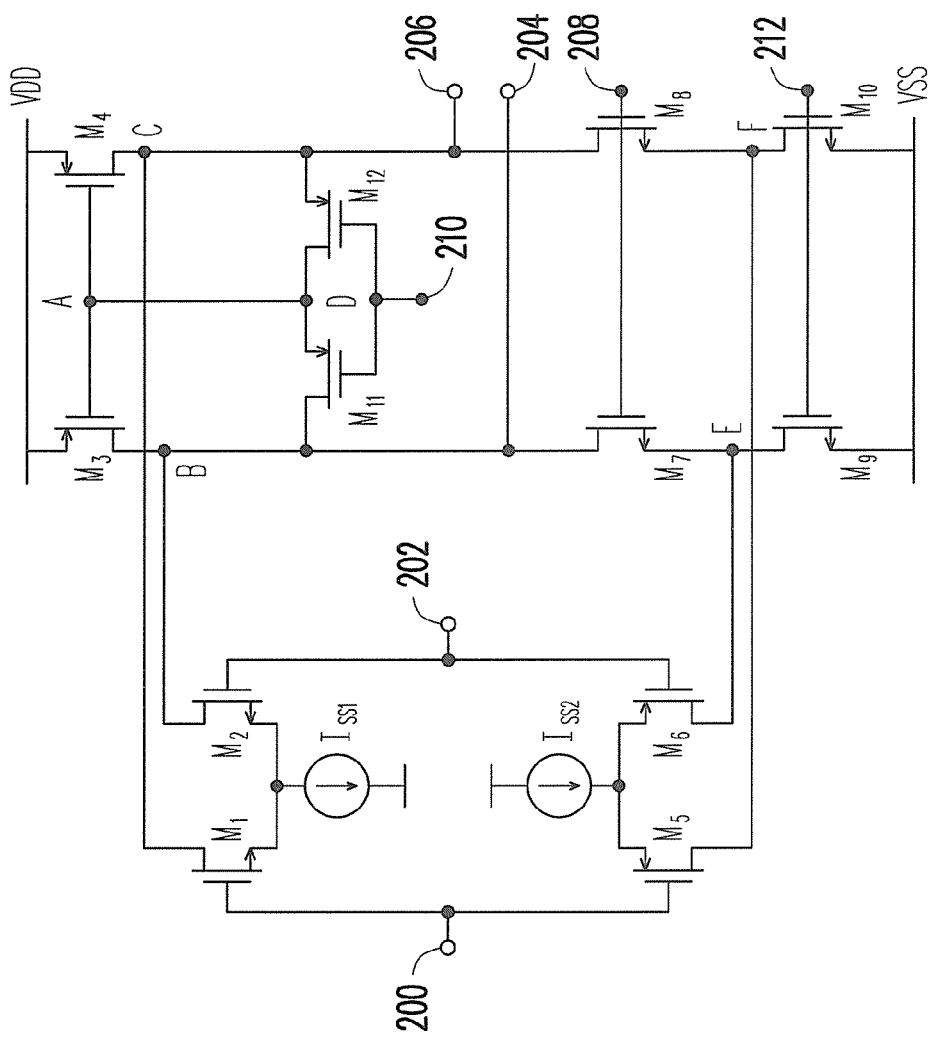
FIG. 6 is a circuit diagram of a differential amplifier according to an embodiment of the present invention.

FIG. 6 is a circuit diagram of a differential amplifier according to an embodiment of the present invention. The differential amplifier in FIG. 6 is another variation of the differential amplifier illustrated in FIG. 3, wherein the impedance devices R1 and R2 are implemented with MOS transistors, such as two PMOS transistors M11 and M12 that are connected with each other in series. The gates of the two PMOS transistors M11 and M12 are both connected to a control terminal 210. Besides, the current sources ISS3 and ISS4 are implemented with MOS transistors, such as NMOS transistors M9 and M10, for generating bias currents. The gates of the transistors M9 and M10 are both connected to the control terminal 212.

Figure 7:
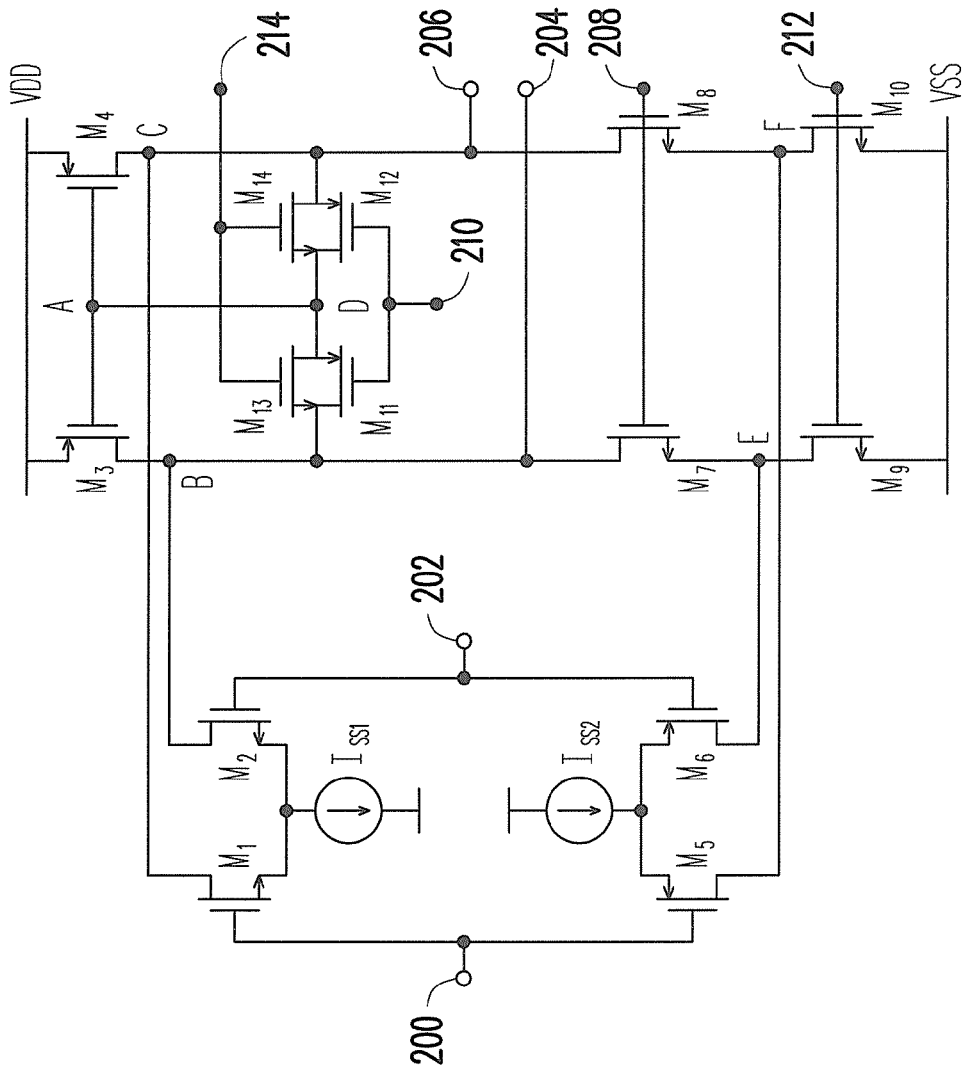
FIG. 7 is a circuit diagram of a differential amplifier according to an embodiment of the present invention.

FIG. 7 is a circuit diagram of a differential amplifier according to an embodiment of the present invention. The differential amplifier in FIG. 7 is another variation of the differential amplifiers illustrated in FIG. 3 and FIG. 6, wherein the impedance devices are implemented by connecting PMOS transistors M11 and M12 and NMOS transistors M13 and M14 in parallel as the impedance devices, and the gates of the transistors M13 and M12 are controlled by a control terminal 214. Besides, the current sources are implemented with NMOS transistors M9 and M10 to generate bias currents.

In other words, the circuit designs of the impedance devices and the current sources are not limited herein. Besides the implementations described above, the functions of the impedance devices and the current sources may also be accomplished in other ways.

As described above, the output common-mode voltage is determined according to the system high voltage VDD. However, the output common-mode voltage may also be determined according to the system low voltage VSS. Below, how the output common-mode voltage is determined according to the system low voltage VSS will be described with reference to an embodiment having the same concept as the embodiment illustrated in FIG. 3.

Figure 8:
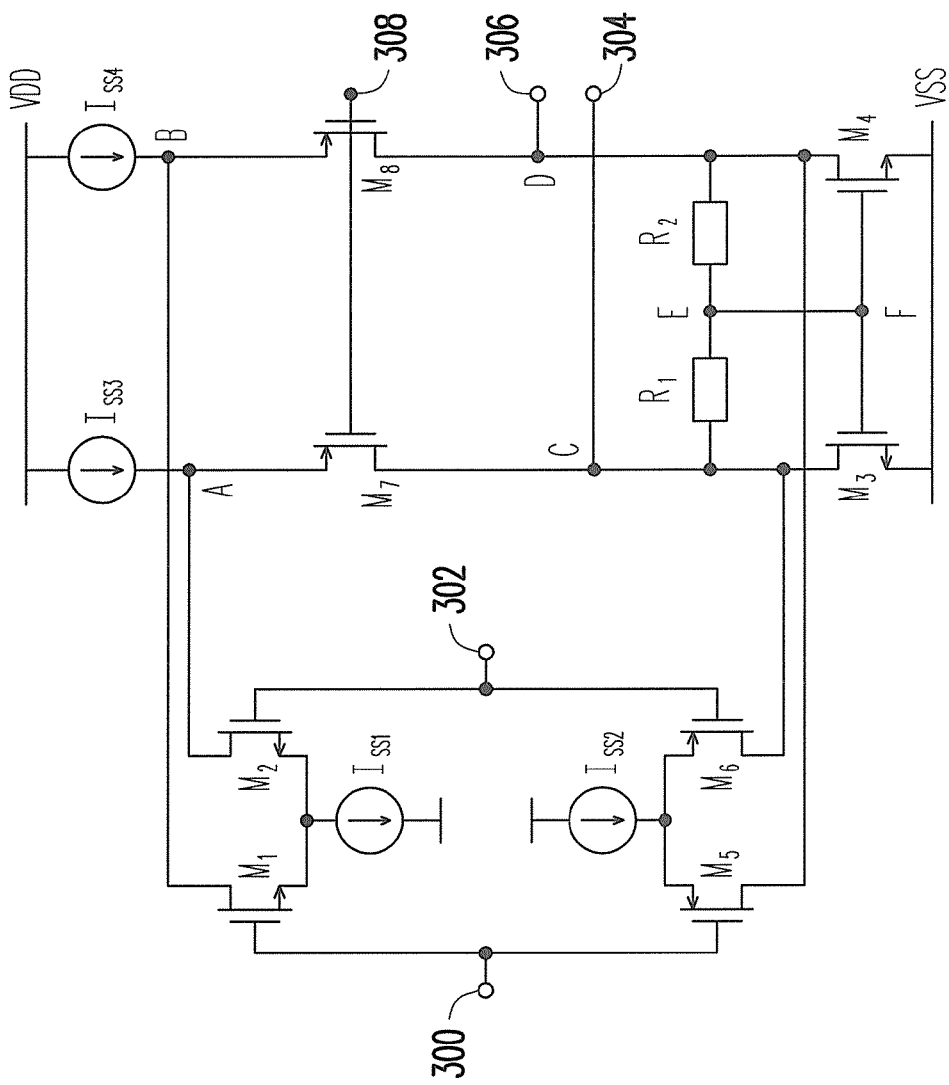
FIG. 8 is a circuit diagram of a differential amplifier according to an embodiment of the present invention.

FIG. 8 is a circuit diagram of a differential amplifier according to an embodiment of the present invention. Referring to FIG. 8, the differential amplifier includes a pair of input transistors M5 and M6, a pair of load transistors M3 and M4, and a pair of impedance devices R1 and R2. The input transistors M5 and M6 provide a pair of input terminals 300 and 302. A pair of sources of the input transistors M5 and M6 is connected to the system high voltage VDD through a current source ISS2. The pair of load transistors M3 and M4 provides a pair of output terminals and has a pair of sources connected to the system low voltage VSS. The pair of impedance devices R1 and R2 is connected between the output terminals 304 and 306 in series. The output terminals 304 and 306 are the nodes C and D. The node E is the connection point between the impedance devices R1 and R2. The node F is the connection point between the gates of the load transistors M3 and M4. The nodes E and F are the same connection point.

The differential amplifier also includes a pair of auxiliary input transistors M1 and M2. The auxiliary input transistors M1 and M2 have a pair of gates, a pair of sources, and a pair of drains, wherein the gates are respectively connected to the input terminals 300 and 302. The input transistors M5 and M6 and the auxiliary input transistors M1 and M2 have reverse conductive type. For example, the input transistors M5 and M6 are PMOS transistors, and the auxiliary input transistors M1 and M2 are NMOS transistors. The sources of the auxiliary input transistors M1 and M2 are coupled to the system low voltage VSS through a current source ISS1.

The differential amplifier further includes a pair of shield transistors M7 and M8. The shield transistors M7 and M8 have a pair of gates, a pair of sources, and a pair of drains, wherein the drains are respectively connected to the drains of the input transistors M5 and M6 and are served as the output terminals 304 and 306 (i.e., the nodes C and D). The sources of the shield transistors M7 and M8 (i.e., the nodes A and B) are respectively coupled to the system high voltage VDD through a pair of current sources ISS3 and ISS4, and which are also respectively coupled to the drains of the auxiliary input transistors M1 and M2.

In the present embodiment, the PMOS input transistors M5 and M6 are served as the input pair, the NMOS load transistors M3 and M4 are served as the loads, and the common-mode voltage of the output terminals 304 and 306 is detected by using the impedance devices R1 and R2 and is connected to the gates of the NMOS load transistors M3 and M4. Accordingly, the output common-mode voltage is determined by the voltage level of the system low voltage VSS (for example, a ground voltage). Namely, the output common-mode voltage is the system low voltage VSS plus the $V_{GS}$ voltage of the load transistors M3 and M4.

In the present embodiment, the NMOS auxiliary input transistors M1 and M2 are disposed to extend the range of the input common-mode voltage, and the drains of the auxiliary input transistors M1 and M2 are connected to the sources of the PMOS shield transistors M7 and M8. The shield transistors M7 and M8 provide a shielding effect such that the voltage at the drains of the auxiliary input transistors M1 and M2 will not be affected by the output voltage of the output terminals 304 and 306 (i.e., the auxiliary input transistors M1 and M2 still operate in the saturation region).

Additionally, the shield transistors M7 and M8 are also served as current buffers for adding up the current signals generated by the auxiliary input transistors M1 and M2 and the current signals generated by the input transistors M5 and M6. The combined current signals flow through equivalent loads to generate a corresponding output voltage. The gain of the circuit is increased due to the existence of the auxiliary NMOS input transistors M1 and M2.

Referring to FIG. 8, the common-mode voltage of the output terminals 304 and 306 is detected by using two impedance devices R1 and R2 and is connected to the gates of the load transistors M3 and M4, wherein the gates are referred to as common-mode terminals. Ideally, the voltage of the common-mode terminals does not change with the differential signal. Namely, the load transistors M3 and M4 are not turned off during current switching and have a fixed $V_{SG}$ voltage and a fixed charging current. In addition, the equivalent differential resistance at the output terminals is determined by the equivalent resistances of the impedance devices R1 and R2 and does not change with the output voltage (i.e., a fixed RC time constant is kept at the output terminals). Thus, in the present embodiment, with sufficient bandwidth, the output high voltage level does not change with the input data frequency, so that inter-symbol interference (ISI) will not be produced.

Besides, in the present embodiment, with the disposition of the auxiliary input transistors M1 and M2, the gain of the circuit is increased, and the range of the input common-mode voltage is greatly extended so that lowest input common-mode voltage and the highest input common-mode voltage are close to the supply rails of the system, and the output common-mode voltage can still be determined by the supply voltage VSS.

In the differential amplifier illustrated in FIG. 8, the impedance devices R1 and R2 may be resistors or achieve the desired resistances through connection of the MOS transistors. Besides, the current sources ISS3 and ISS4 may also be implemented with resistor or MOS transistors.

Figure 9:
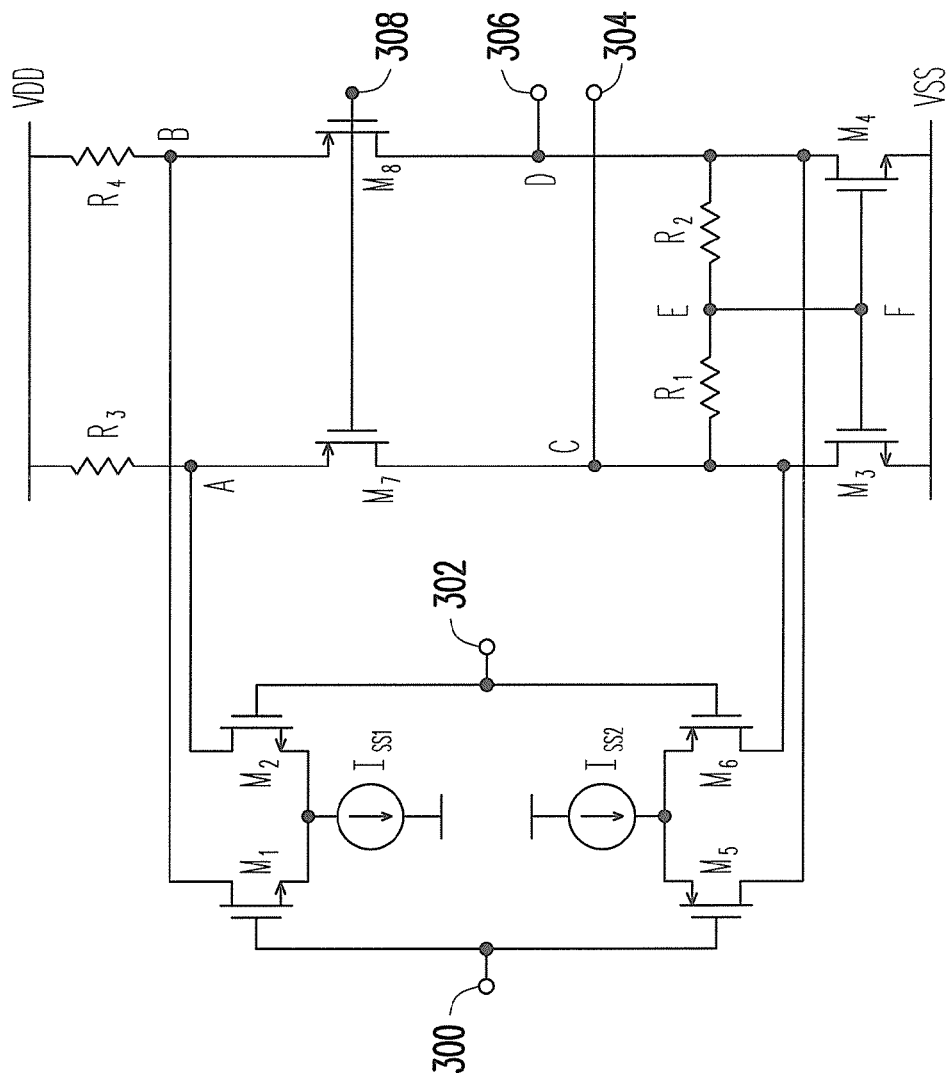
FIG. 9 is a circuit diagram of a differential amplifier according to an embodiment of the present invention.

FIG. 9 is a circuit diagram of a differential amplifier according to an embodiment of the present invention. The differential amplifier in FIG. 9 is derived from that illustrated in FIG. 8, wherein the impedance devices R1 and R2 are implemented with resistors, and the current sources ISS3 and ISS4 are implemented with resistors R3 and R4 to generate bias currents.

Figure 10:
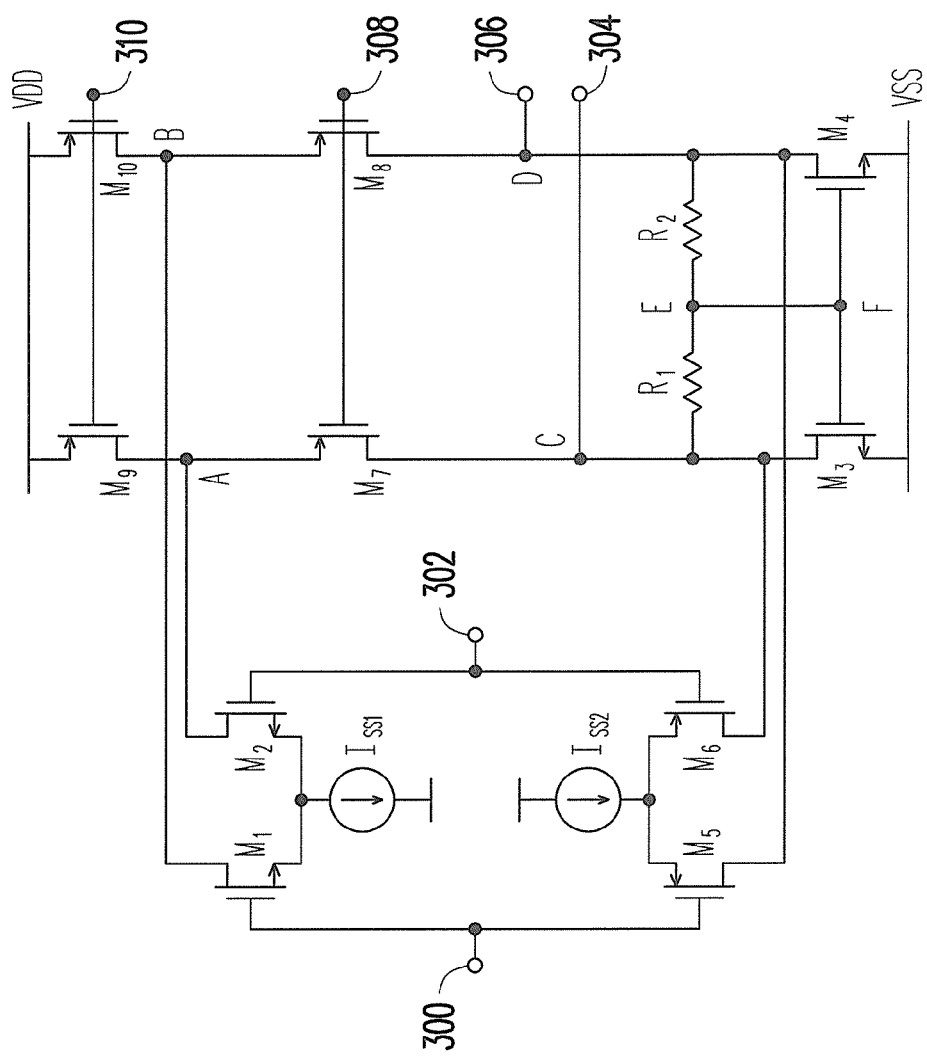
FIG. 10 is a circuit diagram of a differential amplifier according to an embodiment of the present invention.

FIG. 10 is a circuit diagram of a differential amplifier according to an embodiment of the present invention. The differential amplifier in FIG. 10 is another variation of the differential amplifier illustrated in FIG. 8, wherein the impedance devices R1 and R2 are implemented with resistors, and the current sources ISS3 and ISS4 are implemented with PMOS transistors M9 and M10 to generate bias currents. The gates of the PMOS transistors M9 and M10 are both connected to a control terminal 310.

Figure 11:
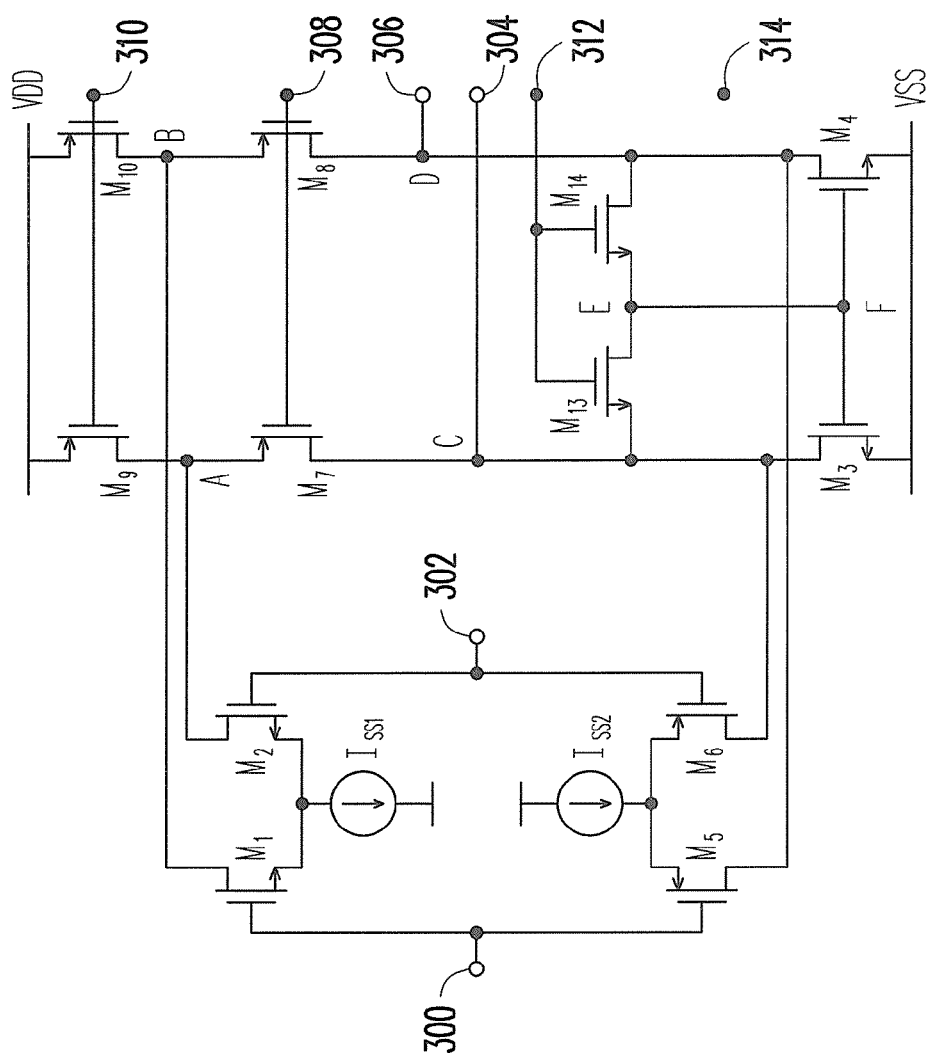
FIG. 11 is a circuit diagram of a differential amplifier according to an embodiment of the present invention.

FIG. 11 is a circuit diagram of a differential amplifier according to an embodiment of the present invention. The differential amplifier in FIG. 11 is yet another variation of the differential amplifier in FIG. 8, wherein the impedance devices R1 and R2 are implemented with MOS transistors (for example, two NMOS transistors M13 and M14 that are connected with each other in series), and the gates of the MOS transistors are both connected to a control terminal 312. Besides, the current sources ISS3 and ISS4 are implemented with MOS transistors, such as PMOS transistors M9 and M10, to generate bias currents, wherein the gates of the transistors M9 and M10 are both connected to a control terminal 310.

Figure 12:
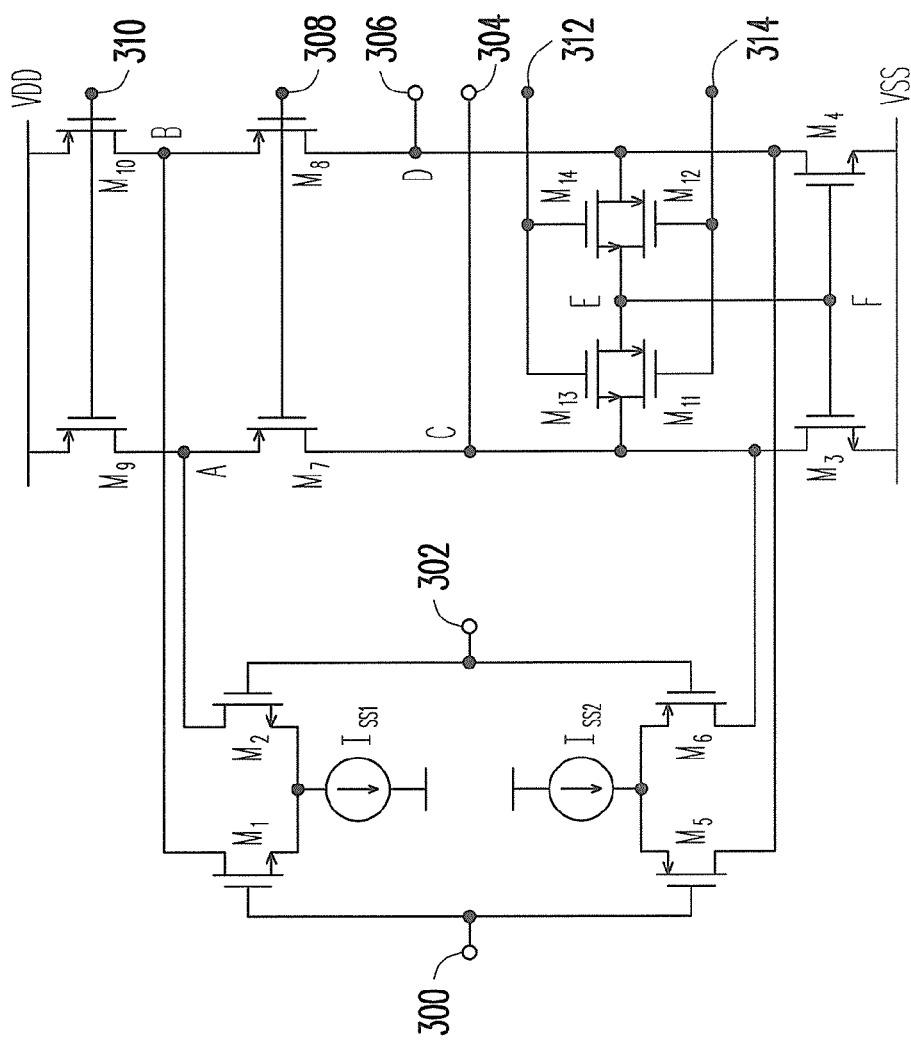
FIG. 12 is a circuit diagram of a differential amplifier according to an embodiment of the present invention.

FIG. 12 is a circuit diagram of a differential amplifier according to an embodiment of the present invention. The differential amplifier in FIG. 12 is another variation of the differential amplifiers illustrated in FIG. 8 and FIG. 11, wherein PMOS transistors M11 and M12 and NMOS transistors M13 and M14 are connected in parallel as the impedance devices, and the gates of the transistors M11 and M12 are controlled by a control terminal 314. Besides, PMOS transistors M9 and M10 are served as the current sources for generating bias currents.

Below, how a differential amplifier is served as a comparator will be explained, wherein the comparator will be used in following application for converting a differential signals into a single-ended signal.

Figure 13:
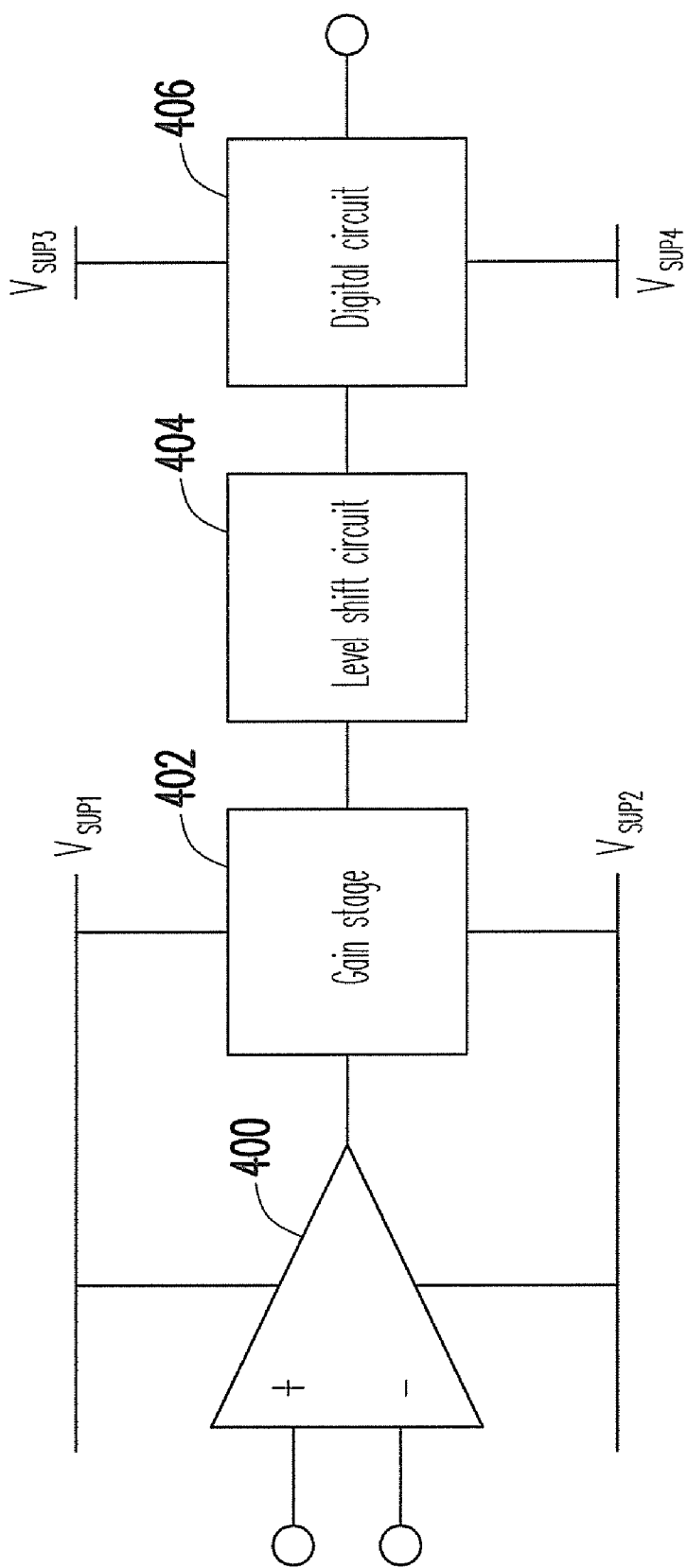
FIG. 13 is a circuit diagram of a high-speed comparator in the present invention.

FIG. 13 is a circuit diagram of a high-speed comparator in the present invention. Referring to FIG. 13, a differential to single-ended conversion circuit includes a differential amplifier 400, a gain stage unit 402, a level shift circuit 404, and a digital circuit 406.

In order to increase operation speed, reduce power consumption, and also reduce electromagnetic interference (EMI), differential signalling is used for high-speed data transmission. Thus, the receiving terminal of an integrated circuit (IC) requires the differential amplifier 400 to amplify small differential input signals. The differential amplifier 400 offers a pre-amplification function and sufficient bandwidth, and a pre-amplified signal is amplified by the gain stage unit 402 into a single-ended CMOS logic signal and output by the same. Generally speaking, the supply voltage of an I/O interface is different from the core voltage inside the IC. Thus, the logic signal amplified at the receiving terminal has to be converted by the level shift circuit 404 into a logic level compatible to the core voltage in the digital circuit 406 inside the IC.

Figure 14:
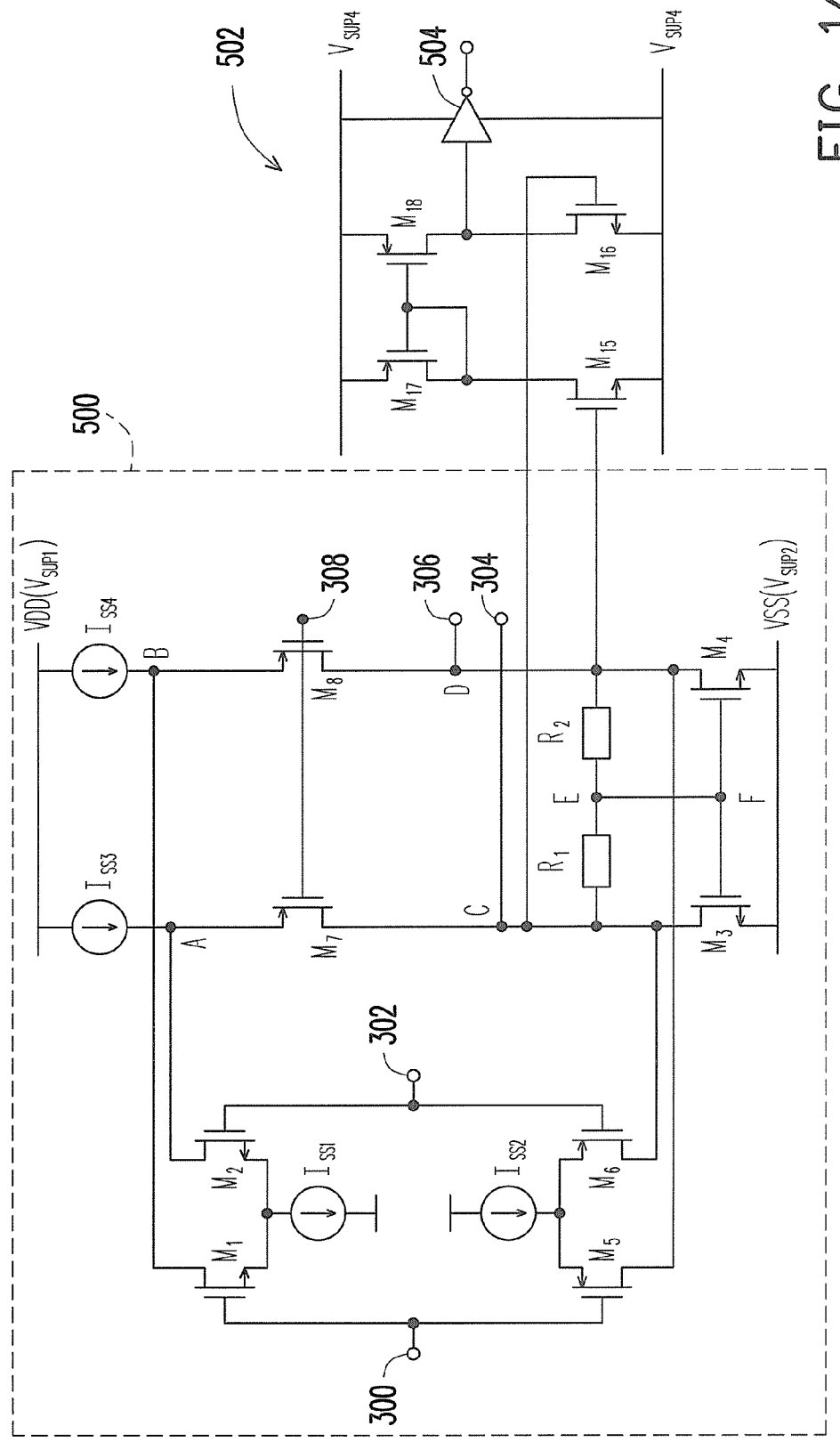
FIG. 14 is a circuit diagram of a high-speed comparator according to an embodiment of the present invention.

The differential amplifiers described above can accomplish the circuit function illustrated in FIG. 13. FIG. 14 is a circuit diagram of a high-speed comparator according to an embodiment of the present invention. Referring to FIG. 14, in the present embodiment, the differential amplifier illustrated in FIG. 8 is used as a front-end differential amplifier 500. The differential signal generated by the differential amplifier 500 are input to the differential to single-ended conversion circuit 502 to be converted into a single-ended output signal.

The output common-mode voltage of the differential amplifier 500 is determined by the supply voltage VSUP2, and in the following stage of the differential to single-ended conversion circuit 502, the NMOS transistors M15 and M16 are served as the input terminals, and the lowest supply voltage of the differential to single-ended conversion circuit 502 thereof is VSUP4 (the level thereof is equal or close to the supply voltage VSUP2). Thus, the differential to single-ended conversion circuit 502 can be biased by using the common-mode output voltage of the differential amplifier 500. PMOS current mirrors M17 and M18 are served as the loads of the NMOS transistors M15 and M16 in the differential to single-ended conversion circuit 502, and which can be connected to the supply voltage VSUP3 different from the supply voltage VSUP1 of the previous stage of differential amplifier 500 (for example, connected to the core voltage inside the IC). Finally, the single-ended voltage is output by an inverter 504. Thereby, the logic signal amplified by the comparator is directly compatible to the logic core voltage signal of the digital circuit 406 inside the IC.

According to the present invention, through the high-speed operation of the front-end differential amplifier 500 and by integrating the gain stage 402 and the level shift circuit 404 with the front-end differential amplifier 500, both the number of circuit devices and the chip area are reduced.

Figure 15:
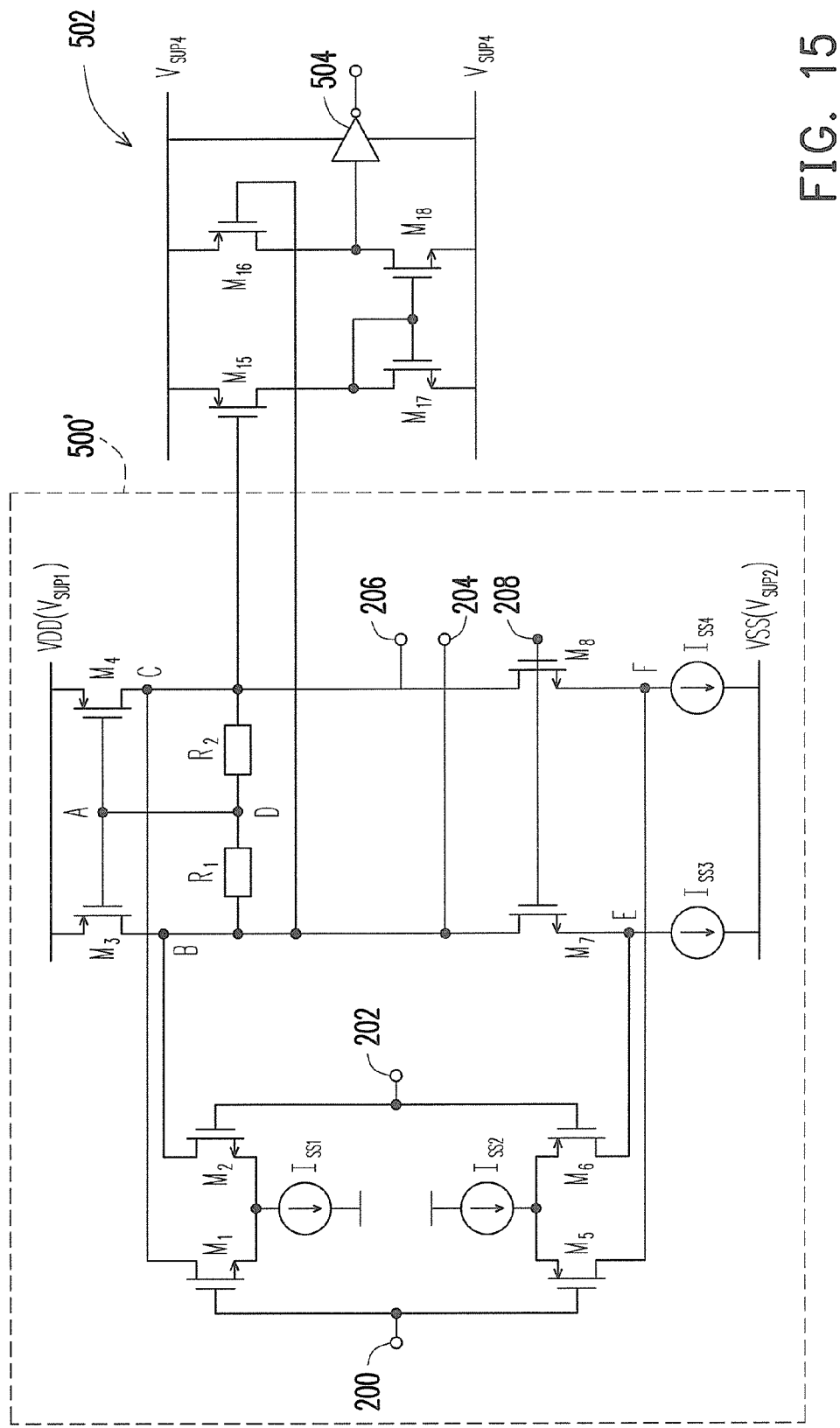
FIG. 15 is a circuit diagram of a high-speed comparator according to an embodiment of the present invention.

Based on the same design concept, the front-end differential amplifier may also be implemented with the circuit illustrated in FIG. 3 according to different applications. FIG. 15 is a circuit diagram of a high-speed comparator according to an embodiment of the present invention. Referring to FIG. 15, the high-speed comparator adopts the circuit structure illustrated in FIG. 3 and is served as a front-end differential amplifier 500'. The output common-mode voltage of the differential amplifier 500' is determined by the supply voltage VSUP1, the PMOS transistors M15 and M16 are served as the input terminals of the differential to single-ended conversion circuit 502, and the highest supply voltage of the differential to single-ended conversion circuit 502 thereof is the supply voltage VSUP4 (the level thereof is equal or close to the supply voltage VSUP1). Thus, the differential to single-ended conversion circuit 502 can be biased by using the common-mode output voltage of the differential amplifier. NMOS current mirrors M17 and M18 are served as the loads of the PMOS transistors M15 and M16, and which can be connected to the supply voltage VSUP4 different from the supply voltage VSUP2 of the previous stage of differential amplifier.

In summary, the present invention provides a differential amplifier, wherein a pair of auxiliary input transistors and a pair of shield transistors are disposed such that the operation speed is increased and the voltage range of the input signal is extended. In addition, the differential amplifier in the present invention can be disposed in a high-speed comparator for front-end differential amplification, so as to increase the operation speed. Moreover, the comparator integrates the gain stage 402 and the level shift circuit 404 with the differential amplifier 400 so that the number of circuit devices and the chip area o are reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A differential amplifier, electrically coupled between a first voltage and a second voltage, comprising:
   a pair of input transistors, for providing a pair of input terminals;
   a pair of load transistors, for providing a pair of output terminals, having a pair of first terminals electrically coupled to the first voltage;
   a pair of impedance devices, electrically coupled between the pair of output terminals in series;
   a pair of auxiliary input transistors, having a pair of control terminals, a pair of first terminals, and a pair of second terminals, wherein the pair of control terminals are respectively electrically coupled to the pair of input terminals, wherein the pair of input transistors and the pair of auxiliary input transistors have reverse conductive type; and
   a pair of shield transistors, having a pair of control terminals, a pair of first terminals, and a pair of second terminals, wherein the pair of first terminals are respectively electrically coupled to the pair of second terminals of the pair of auxiliary input transistors and are coupled to the second voltage through a pair of current sources, wherein the pair of second terminals are respectively electrically coupled to the pair of output terminals,
   wherein the pair of impedance devices has a connection node between the pair of output terminals, the connection node is also connected to gate electrodes of the pair of auxiliary input transistors or gate electrodes of the pair of shield transistors.

2. The differential amplifier according to claim 1, wherein the first voltage and the second voltage are a combination of a system high voltage and a system low voltage, and the pair of input transistors comprises:
   a pair of first terminals, connected with each other, and coupled to the second voltage through a current source circuit;
   a pair of control terminals, respectively electrically coupled to the pair of input terminals; and
   a pair of second terminals, respectively electrically coupled to a pair of second terminals of the pair of load transistors as the pair of output terminals.

3. The differential amplifier according to claim 2, wherein the pair of first terminals of the pair of auxiliary input transistors is coupled to the first voltage through a current source circuit.

4. The differential amplifier according to claim 1, wherein the pair of control terminals of the pair of shield transistors is electrically coupled to an external control terminal.

5. The differential amplifier according to claim 1, wherein the pair of current sources coupled to the pair of second terminals of the pair of auxiliary input transistors is resistors or metal-oxide-semiconductor (MOS) transistors.

6. The differential amplifier according to claim 1, wherein the pair of impedance devices is constituted by resistors, a MOS transistor, or a plurality of MOS transistors that are coupled together.

7. The differential amplifier according to claim 1 further comprising a differential to single-ended conversion circuit, wherein the differential to single-ended conversion circuit receives a pair of differential voltage signals from the pair of output terminals and converts the pair of differential voltage signals into an output voltage signal.

8. The differential amplifier according to claim 1, wherein the pair of auxiliary input transistors are P-type MOS (PMOS) transistors, and the pair of input transistors are N-type MOS (NMOS) transistors.

9. The differential amplifier according to claim 1, wherein the differential amplifier is served as a comparator, and the pair of output terminals of the comparator are subsequently coupled to a pair of input terminals of a differential to single-ended conversion circuit.

10. The differential amplifier according to claim 9, wherein the differential to single-ended conversion circuit comprises:
   a pair of receiving transistors, having a pair of control terminals, a pair of first terminals, and a pair of second terminals, wherein the pair of control terminals are electrically coupled to the pair of output terminals of the comparator, and the pair of first terminals are coupled to a third voltage;
   a pair of current mirror transistors, having a pair of control terminals, a pair of second terminals, and a pair of first terminals, wherein the pair of first terminals are electrically coupled to a fourth voltage, the pair of second terminals are respectively electrically coupled to the pair of second terminals of the pair of receiving transistors, and the pair of control terminals are electrically coupled with each other; and
   an inverter, having two voltage control terminals, an output terminal, and an input terminal, wherein the voltage control terminals are respectively electrically coupled to the third voltage and the fourth voltage,
   wherein one of the pair of second terminals of the pair of receiving transistors is electrically coupled to the pair of control terminals of the pair of current minor transistors, and another one of the pair of second terminals is electrically coupled to the input terminal of the inverter.

11. A differential amplifier, electrically coupled between a first voltage and a second voltage, comprising:
   a pair of input transistors, for providing a pair of input terminals;
   a pair of load transistors, for providing a pair of output terminals, having a pair of first terminals electrically coupled to the first voltage;
   a pair of impedance devices, electrically coupled between the pair of output terminals in series;

a pair of auxiliary input transistors, having a pair of control terminals, a pair of first terminals, and a pair of second terminals, wherein the pair of control terminals are respectively electrically coupled to the pair of input terminals, wherein the pair of input transistors and the pair of auxiliary input transistors have reverse conductive type; and a pair of shield transistors, having a pair of control terminals, a pair of first terminals, and a pair of second terminals, wherein the pair of first terminals are respectively electrically coupled to the pair of second terminals of the pair of auxiliary input transistors and are coupled to the second voltage through a pair of current sources, wherein the pair of second terminals are respectively electrically coupled to the pair of output terminals, wherein the pair of impedance devices has a connection node between the pair of output terminals, the connection node is also connected to gate electrodes of the pair of auxiliary input transistors.

12. A differential amplifier, electrically coupled between a first voltage and a second voltage, comprising:

a pair of input transistors, for providing a pair of input terminals;

a pair of load transistors, for providing a pair of output terminals, having a pair of first terminals electrically coupled to the first voltage;

a pair of impedance devices, electrically coupled between the pair of output terminals in series;

a pair of auxiliary input transistors, having a pair of control terminals, a pair of first terminals, and a pair of second terminals, wherein the pair of control terminals are respectively electrically coupled to the pair of input terminals, wherein the pair of input transistors and the pair of auxiliary input transistors have reverse conductive type; and a pair of shield transistors, having a pair of control terminals, a pair of first terminals, and a pair of second terminals, wherein the pair of first terminals are respectively electrically coupled to the pair of second terminals of the pair of auxiliary input transistors and are coupled to the second voltage through a pair of current sources, wherein the pair of second terminals are respectively electrically coupled to the pair of output terminals, wherein the pair of impedance devices has a connection node between the pair of output terminals, the connection node is also connected to gate electrodes of the pair of shield transistors.

* * * * *